United States Patent
Searls et al.

(10) Patent No.: US 6,713,871 B2
(45) Date of Patent: Mar. 30, 2004

(54) SURFACE MOUNT SOLDER METHOD AND APPARATUS FOR DECOUPLING CAPACITANCE AND PROCESS OF MAKING

(75) Inventors: Damion T. Searls, Portland, OR (US); Weston C. Roth, Hillsboro, OR (US); James Daniel Jackson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/152,524

(22) Filed: May 21, 2002

(65) Prior Publication Data

US 2003/0218235 A1 Nov. 27, 2003

(51) Int. Cl.⁷ ............................................... H01L 23/52
(52) U.S. Cl. ...................... 257/738; 257/535; 257/665; 257/734; 257/780; 438/215; 438/613
(58) Field of Search ................................ 257/532, 535, 257/6, 65, 734, 73, 7, 738, 780, 924; 438/957, 215, 613

(56) References Cited

U.S. PATENT DOCUMENTS 6,326,677 B1 * 12/2001 Bloom et al. ................ 257/638
6,330,164 B1 * 12/2001 Khandros et al. ........... 361/760

OTHER PUBLICATIONS

Zhao et al., "Effects of Power/Ground Via Distribution on the Power/Ground Performance of C4/BGA Packages", Oct. 26, 1998, Sigrity Technical Papers.*

* cited by examiner

*Primary Examiner*—Nathan J. Flynn
*Assistant Examiner*—Scott R. Wilson (57) ABSTRACT

A system to package high performance microelectronic devices, such as processors, responds to component transients. In one embodiment, the system includes a decoupling capacitor that is disposed between a Vcc electrical bump and a Vss electrical bump. The decoupling capacitor has Vcc and Vss terminals. The Vcc and Vss terminals share electrical pads with the Vcc electrical bump and the Vss electrical bump. A simple current loop is created that improves the power delivery for the system.

25 Claims, 6 Drawing Sheets

SURFACE MOUNT SOLDER METHOD AND APPARATUS FOR DECOUPLING CAPACITANCE AND PROCESS OF MAKING

TECHNICAL FIELD

Embodiments of the present invention relate to a surface-mount solder method and apparatus for improved decoupling capacitance.

BACKGROUND INFORMATION

DESCRIPTION OF RELATED ART

Power delivery is a significant concern in the design and operation of a microelectronic device. Where the microelectronic device is a processor or an application-specific integrated circuit (ASIC), an adequate current delivery, a steady voltage, and an acceptable processor transient response are desirable characteristics of the overall microelectronic device package. One of the methods for responding to a processor transient is to place a high-performance capacitor as close to the processor as possible to shorten the transient response time. Although a large-capacity and high-performance capacitor is preferable to answer the processor transients, the capacitor is in competition for space in the immediate vicinity of the processor. This may involve making a cutout in a portion of a board or socket to make room for the capacitor. A cutout in a board is a factor for increasing overall package size, which is counter to the trend to miniaturize. A cutout is also a factor for increasing the loop inductance path for a package, which can have a negative impact on the performance of the microelectronic device.

Figure 11:
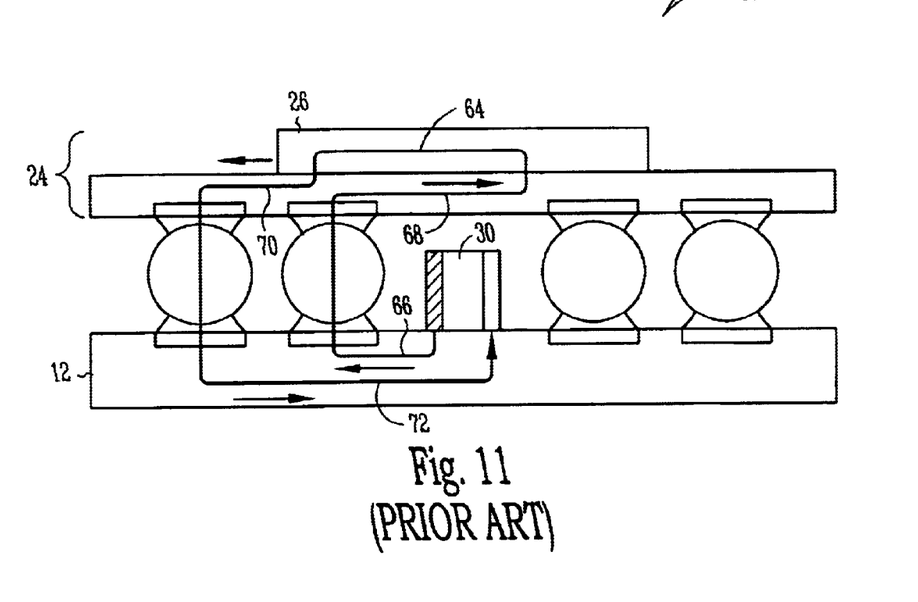
FIG. 11 is an elevational cut-away of an existing system.

The loop inductance path is often a convoluted path that complicates the impedance of the package. FIG. 11 is a depiction of an existing system 10 including a substrate 12 and a top structure 24 that includes an electronic component 26. A decoupling capacitor 30 is mounted upon the substrate 12. A convoluted current path 64 can be traced between the capacitor 30, the electronic component 26, and back to the capacitor 30. A convoluted path 64 or convoluted inductance loop is defined as a current that flows in a first pre-component direction 66 and in a substantially reverse, second pre-component direction 68. "Pre-component" means that the current in this section of the current-convoluted current loop path 64 has not passed, either in whole or in part, through the component 26, but it has reversed its flow direction. A convoluted path is also defined as a current that flows in a first post-component direction 70 and a substantially reverse, second post-component direction 72. "Post-component" means that the current in this section of the convoluted current loop path 64 has not passed, either in whole or in party, through the component 26 but it likewise has reversed its flow direction. Such reversal of flow direction creates complicated inductance that is detrimental to performance.

BRIEF DESCRIPTION OF THE DRAWINGS

In order to understand the manner in which embodiments of the present invention are obtained, a more particular description of various embodiments of the invention briefly described above will be rendered by reference to the appended drawings. Understanding that these drawings depict only typical embodiments of the invention that are not necessarily drawn to scale and are not therefore to be considered to be limiting of its scope, the embodiments of the invention will be described and explained with additional specificity and detail through the use of the accompanying drawings in which.

DETAILED DESCRIPTION

The following description includes terms, such as upper, lower, first, second, etc. that are used for descriptive purposes only and that are not to be construed as limiting. The embodiments of a device or article of the present invention described herein can be manufactured, used, or shipped in a number of positions and orientations. The terms "die" and "processor" generally refer to the physical object that is the basic workpiece that is transformed by various process operations into the desired integrated circuit device. A component is typically a packaged die made of semiconductive material that has been singulated from a wafer after integrated processing. Wafers may be made of semiconducting, non-semiconducting, or combinations of semiconducting and non-semiconducting materials.

Reference will now be made to the drawings, wherein like structures will be provided with like reference designations. In order to show the structures of embodiments of the present invention most clearly, the drawings included herein are diagrammatic representations of inventive articles. Thus, the actual appearance of the fabricated structures, for example in a photomicrograph, may appear different while still incorporating the essential structures of embodiments of the present invention. Moreover, the drawings show only the structures necessary to understand the embodiments of the present invention. Additional structures known in the art have not been included to maintain the clarity of the drawings.

Figure 1:
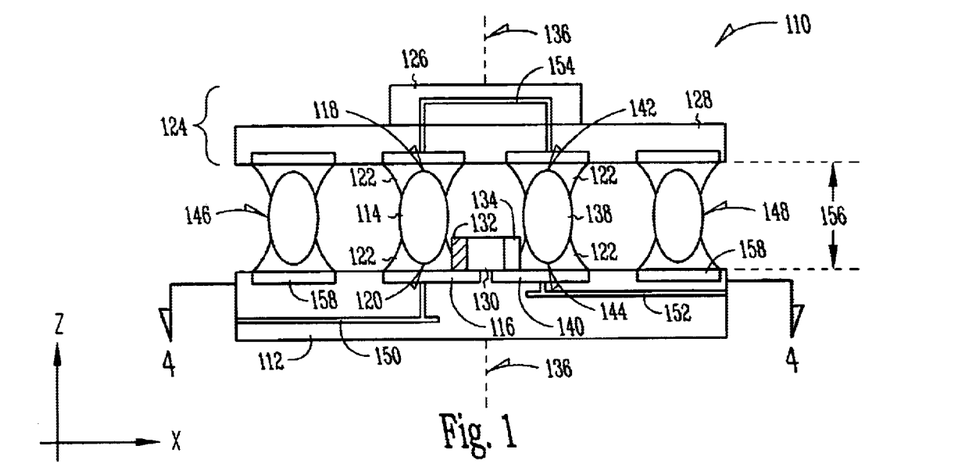
FIG. 1 is an elevational cut-away of a system according to an embodiment.

FIG. 1 is an elevational section of a system 110 according to an embodiment. The system 110 relates to a decoupling capacitor system. The system 110 includes a substrate 112, and an electrical first bump 114 that is adhered to a substrate first pad 116.

In one embodiment, the substrate 112 is a motherboard for a digital computer, an electronic apparatus, or the like. In another embodiment, the substrate 112 is a main board for a specialized device such as a hand-held personal digital assistant (PDA) or the like. In one embodiment, the substrate 112 is a board for a wireless device or the like.

The electrical first bump 114 is typically a high melting-point solder that includes a top end 118 and a bottom end 120. Adhesion of the electrical first bump 114 to the substrate first pad 116 is by a low melting-point solder 122. Both the electrical first bump 114 and the low melting-point solder 122 may be a Pb-containing solder or a substantially Pb-free solder. By "substantially Pb-free solder" it is meant that the solder is not designed with Pb content according to industry trends. One example of a Pb-containing solder includes a tin-lead solder. In selected embodiments, Pb-containing solder is a tin-lead solder composition such as from Sn97Pb. One tin-lead solder composition that may be used with a top structure 124 that is to be mounted over the substrate is a Sn37Pb composition. In any event, the Pb-containing solder may be a tin-lead solder comprising $Sn_xPb_y$, wherein x+y total 1, and wherein x is in a range from about 0.3 to about 0.99. In one embodiment, the Pb-containing solder for the electrical first bump 114 is a tin-lead solder composition of Sn97Pb, and the lower melting-point solder 122 is a tin-lead solder composition of Sn37Pb.

A top structure 124 is disposed at the top end 118 of the electrical first bump 114. In one embodiment, the top structure 124 includes an electronic component 126 such as a processor, an ASIC, or the like. In one embodiment, the top structure 124 includes a power socket 128 that carries an electronic component 126. In one embodiment, the top structure 124 includes an interposer (also represented generally as item 128) that may make connection with an electronic component and/or a power socket. In one embodiment, the top structure 124 includes a combination of at least two of an electronic component, a power socket, and an interposer. Alternatively, the top structure 124 is a packaged electronic component without a power socket or the like, or without an interposer or the like, or without either.

A decoupling capacitor 130 is disposed above the substrate 112 and is substantially contiguous to the electrical first bump 114. The capacitor 130 includes a power or Vcc terminal 132 and a ground or Vss terminal 134. By "substantially contiguous" it is meant that the capacitor 130 and the electrical first bump 114 are electrically touching at or near the power terminal 132. In another embodiment, "substantially contiguous" means that there is no structure laterally closer to the electrical first bump 114 than the power terminal 132 of the capacitor 130. In yet another embodiment, "substantially contiguous" means that the decoupling capacitor is placed proximate the electrical first bump 114, within about one lateral diameter (in the X-dimension) of the electrical first bump 114.

In one embodiment, the capacitor 130 is placed beneath the electronic component 126 and is substantially centered along a symmetry line 136 that bisects the electronic component 126 in the X-dimension. More particularly, the capacitor 130 is disposed between the electrical first bump 114 and an electrical second bump 138 that is substantially contiguous to the ground terminal 134. The electrical second bump 138 is adhered to a substrate second pad 140. Like the electrical first bump 114, the electrical second bump 138 is typically a high melting-point solder that includes a top end 142 and a bottom end 144. Adhesion of the electrical second bump 138 to the substrate second pad 140 is by the low melting-point solder 122.

The electrical first bump 114 includes a first characteristic vertical dimension (in the Z-dimension) that originates at or near the substrate first pad 116 and that terminates near the top structure 124. The electrical second bump 138 includes a second characteristic vertical dimension that is substantially equal to the first characteristic vertical dimension of the electrical first bump 114. The capacitor 130 includes a third characteristic vertical dimension that originates at or near the substrate first pad 116 and that terminates below the top structure 124. In one embodiment, the capacitor 130 is provided in parallel with at least one other capacitor (not pictured, but either above or below the plane of FIG. 1) with relation to the electronic component 126.

Other electrical bumps 146 and 148 are depicted in FIG. 1. In one embodiment, the other electrical bumps 146 and 148 are additional power and ground contacts for the electronic component 126. In an embodiment as depicted in FIG. 1, a power plane 150 and a ground plane 152 are depicted within the substrate 112. The other electrical bumps 146 and 148 are not depicted as connected to the power plane 150 or the ground plane 152 and are consequently for data and control signaling to the electronic component 126.

A simplified electrical path is depicted in FIG. 1. Current at a given potential (Vcc) passes from the power plane 150 into the electrical first bump 114. Under proper transient conditions caused by a transient load in the electronic component 126, the power also passes through the power terminal 132 of the capacitor 130 and continues through a loop-turnaround sub-path 154 (generically depicted) that supplies power to the electronic component 126. Thereafter, a ground current passes from the loop-turnaround sub-path 154 into the electrical second bump 138 and the ground terminal 134 of the capacitor 130.

This simplified path has various characteristics. One characteristic is that the current loop can be shorter than the conventional, on the order of up to about 15 times shorter. In another embodiment, the current loop is shorter than the conventional, on the order of up to about 40 times shorter. Another characteristic is that no additional conductive material is needed in the substrate 112 compared to its need in conventional applications. Another characteristic is that the DC path and the AC path are identical.

FIG. 1 depicts the electrical first bump 114 and the electrical second bump 138 as having an oblong shape that gives each bump an aspect ratio (height:width) of greater than one. In one embodiment, the standoff 156, the measure of clearance between the substrate 112 and the top structure 124, is increased by having electrical bumps with an aspect ratio of greater than one, although the aspect ratio may be substantially equal to one. Where a high-performance capacitor is selected, it may have a third characteristic vertical dimension that is less than the first characteristic vertical dimension of the electrical first bump 114.

The standoff 156 is illustrated as being achieved due to the aspect ratio of the electrical first bump 114 and the electrical second bump 138. Although a high melting point solder is depicted at each electrical coupling in FIG. 1 (as well as FIGS. 2–3, and 6–10), it is noted that in one embodiment, not all electrical couplings have the high melting-point solder. In one embodiment, at least one electrical coupling that includes a capacitor (such as capacitor 130 in FIG. 1) does not include a high melting-point solder. In another embodiment, only perimeter electrical couplings include a high melting-point solder. In another embodiment, interspersed electrical couplings, such as grouped or alternating electrical couplings include a high melting-point solder. By way of non-limiting example for this embodiment, an alternating distribution of the high melting-point solder is distributed around the perimeter of a substrate such as substrate 112. In another embodiment, at least one electrical coupling that is adjacent a capacitor (such as the electrical bumps 146 and 148 in FIG. 1) has the high melting-point solder and the electrical couplings that touch the capacitor 130 do not. In another embodiment, the high melting-point solder is distributed to selected electrical couplings that amount to less than the total thereof, according to a specific application that allows the standoff 156 to be maintained. In another embodiment a fraction of the capacitor-sharing electrical couplings have the high melting-point solder. As depicted in the figures, one embodiment includes the high melting-point solder at each electrical coupling.

In a general embodiment, the choice to mount the decoupling capacitor upon the substrate or on the top structure is influenced, among other reasons, by transient time response, di/dt, heat expansion disparities between the capacitor structure and the structure it is mounted upon, and combinations thereof.

Figure 2:
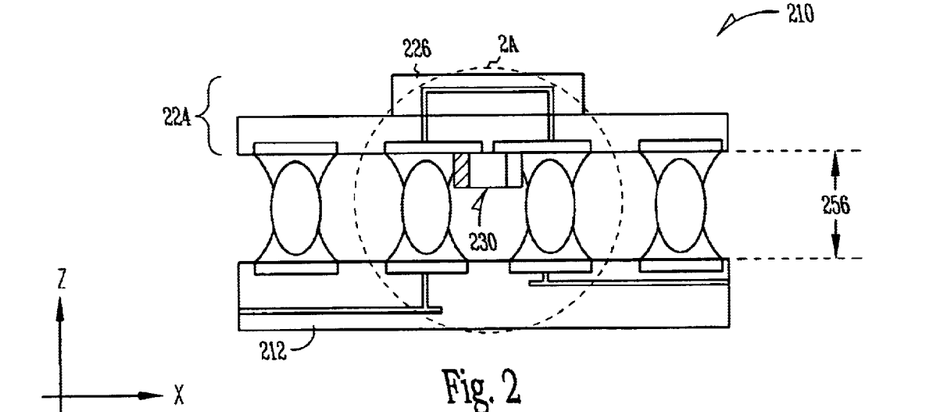
FIG. 2 is an elevational cut-away of another system according to an embodiment.

FIG. 2 is an elevational section of another system 210 according to an embodiment. The decoupling capacitor system 210 illustrated in FIG. 2 is similar to the decoupling capacitor system 110 depicted in FIG. 1. In some embodiments, a capacitor 230 is disposed upon the top structure 224 instead of on the substrate 212. This places the capacitor 230 even closer to the electronic component 226, where sufficient standoff 256 allows.

Figure 2A:
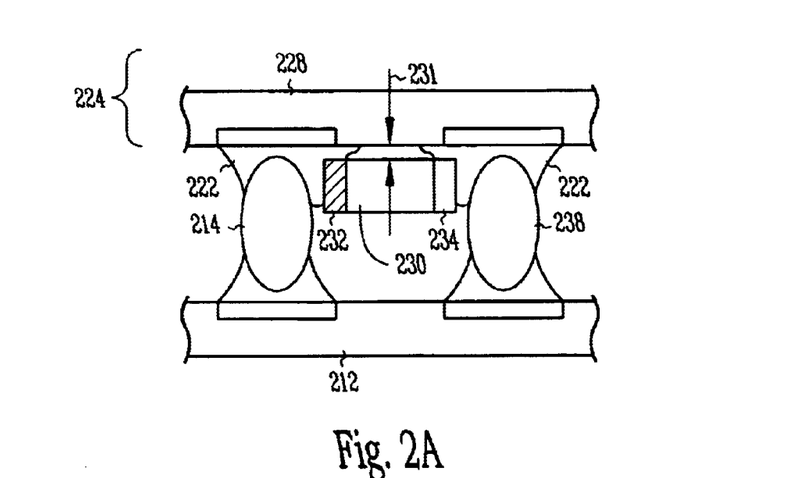
FIG. 2A is a detail section of FIG. 2, taken along the line 2A.

FIG. 2A is a detail section of FIG. 2, taken along the line 2A. FIG. 2A depicts an alternative embodiment. In contrast to the capacitor 230 in FIG. 2, the capacitor 230 in FIG. 2A has been mounted in the solder 222 with a capacitor standoff 231 such that the capacitor 230 is not in direct contact with the socket 228 against the underside. The capacitor standoff 231 allows for more thermal expansion differences because the capacitor 230 is substantially suspended in the softer solder 222. Similar to the structure depicted in FIG. 1, the structure includes a substrate 212, an electrical first bump 214. Adhesion of the electrical first bump 214 to a substrate first pad 216 is by a low melting-point solder 222. A top structure 224 includes a power socket 228 that carries an electronic component (not pictured). The decoupling capacitor 230 is disposed above the substrate 212 and is substantially contiguous to the electrical first bump 214. The capacitor 230 includes a power or Vcc terminal 232 and a ground or Vss terminal 234. By "substantially contiguous" it is meant that the capacitor 230 and the electrical first bump 214 are electrically coupled at or near the power terminal 232. An electrical second bump 238 is coupled to the Vss terminal 234 through the solder 222.

By disclosure of this embodiment with the capacitor standoff 231, it is noted that this embodiment is an alternative embodiment for each structure depicted in this disclosure.

Figure 3:
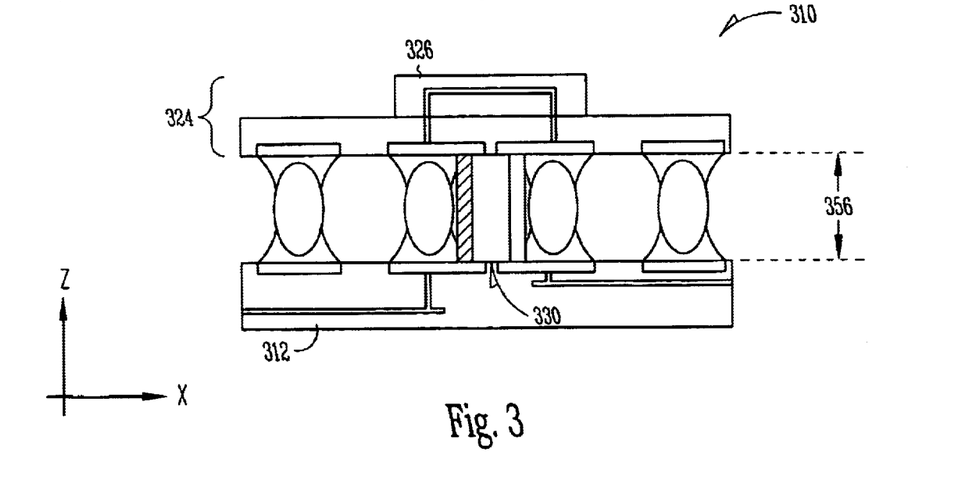
FIG. 3 is an elevational cut-away of yet another system according to an embodiment.

FIG. 3 is an elevational cut-away of yet another system 310 according to an embodiment. The decoupling capacitor system 310 illustrated in FIG. 3 is similar to the decoupling capacitor system 110 depicted in FIG. 1 and to the decoupling capacitor system 210 depicted in FIG. 2. In the embodiment illustrated in FIG. 3, a capacitor 330 is disposed both upon the substrate 312 and upon the top structure 324. In comparison to the capacitors depicted in FIGS. 1 and 2, the capacitor 230 has a larger discharge volume, but may have a slower response time to a transient, di/dt, of the component 326. In one embodiment, the capacitor 330 is limited in its characteristic vertical dimension by the standoff 356 of the decoupling capacitor system 310.

Figure 4:
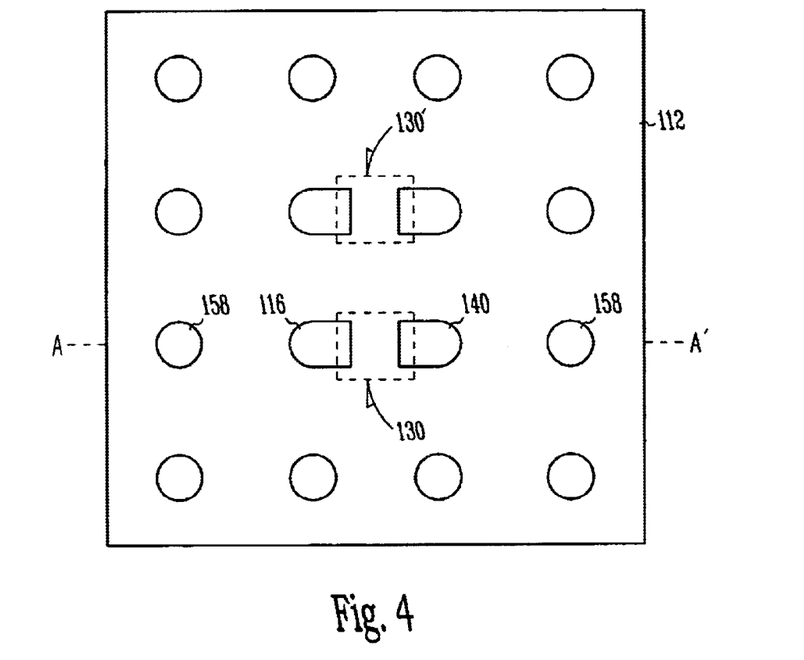
FIG. 4 is a top plan of the substrate illustrated in FIG. 1, taken along the section line 4—4.

FIG. 4 is a top plan of the substrate 112 depicted in FIG. 1, taken along the section line 4—4. The view along the section line 4—4 in FIG. 1 is seen at the section line A–A' in FIG. 4. The substrate 112 includes the substrate first pad 116 that makes contact with the electrical first bump 114 (refer to FIG. 1), and it includes the substrate second pad 140 that makes contact with the electrical second bump 138 (refer to FIG. 1). It is noted that the perimeters of the substrate first pad 116 that and the substrate second pad 140 have been configured to accommodate the substantially rounded shape of the bump at one end, and the substantially rectangular shape of the capacitor at the opposite end.

Still referring to FIG. 4, a plurality of data/control pads 158 are additionally depicted. FIG. 4 illustrates the footprint of the capacitor 130 by a dashed-line perimeter. FIG. 4 illustrates another capacitor footprint 130' by a dashed-line perimeter. The capacitor 130' would appear in FIG. 1 below the plane of the figure. As illustrated, the substrate first pad 116 accommodates both the electrical first bump 114 (refer to FIG. 1) and the power terminal 132 (refer to FIG. 1) of the capacitor 130. Accordingly there exists an article embodiment that includes the substrate first pad 116 (coupled to Vcc) that includes a first region that has a shape or footprint characteristic of the electrical first bump 114 (coupled to Vcc), and a second region that has a shape or footprint characteristic of the power terminal 132.

In one embodiment, it is preferable to tie together a plurality of Vcc sources as pads, and to tie together a plurality of Vss sources as pads, as will now be discussed with reference to FIG. 5.

Figure 5:
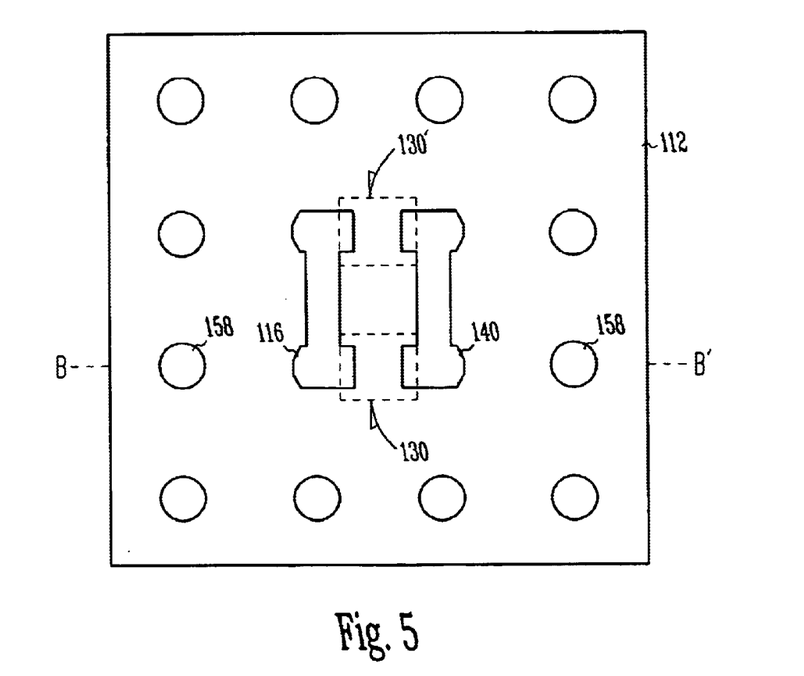
FIG. 5 is an alternative top plan of the substrate illustrated in FIG. 1, taken along the section line 4—4.

FIG. 5 is an alternative top plan of the substrate 112 depicted in FIG. 1, taken along the section line 4—4. The view of the substrate 112 in FIG. 5 is similar to the view of the substrate 112 in FIG. 3. The view along the section line 4—4 in FIG. 1 is seen at the section line B–B' as seen in FIG. 5. The substrate 112 includes the substrate first pad 116 that makes contact with the electrical first bump 114 (refer to FIG. 1), and it includes the substrate second pad 140 that makes contact with the electrical second bump 138 (refer to FIG. 1). Still referring to FIG. 5, a plurality of data/control pads 158 are additionally depicted. FIG. 5 illustrates the footprint of the capacitor 130 by a dashed-line perimeter. FIG. 5 illustrates another capacitor footprint 130' by a dashed-line perimeter. The capacitor 130' would appear in FIG. 1 below the plane of the figure. As illustrated, the substrate first pad 116 accommodates both the electrical first bump 114 (refer to FIG. 1) and the power terminal 132 (refer to FIG. 1) of the capacitor 130.

Figure 5A:
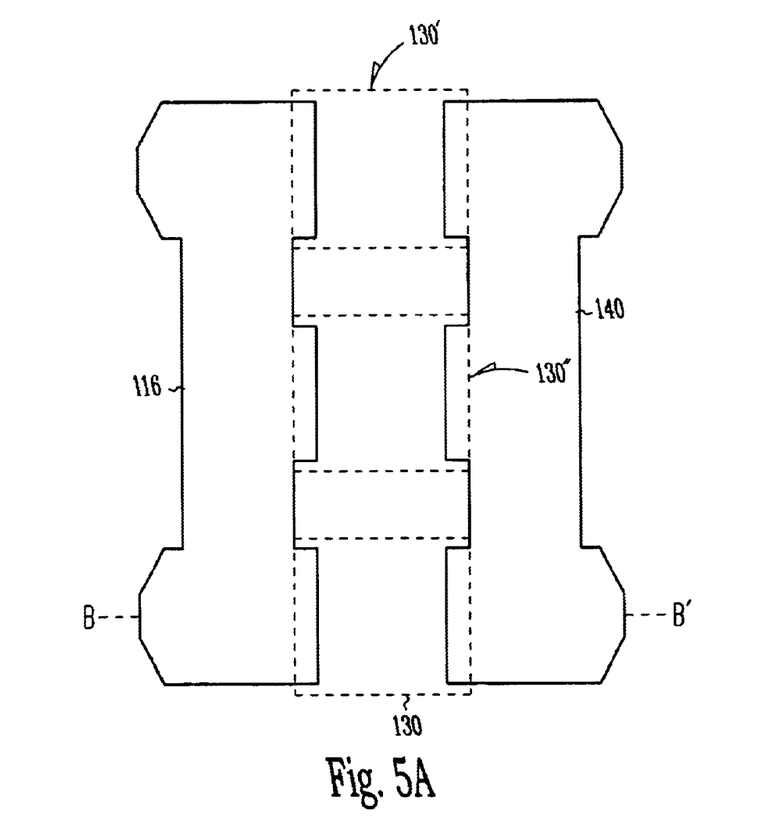
FIG. 5A is yet another alternative top plan of the substrate 112 depicted in FIG. 1.

FIG. 5A is yet another alternative top plan of the substrate 112 depicted in FIG. 1, taken along the section line 4—4. The view of the substrate 112 in FIG. 5A is a close-up of the substrate first pad 116 that makes contact with the electrical first bump 114 (refer to FIG. 1), and it includes the substrate second pad 140 that makes contact with the electrical second bump 138 (refer to FIG. 1), although the shapes thereof can be different. FIG. 5A illustrates the footprint of the capacitor 130 by a dashed-line perimeter. FIG. 5A illustrates another capacitor footprint 130' by a dashed-line perimeter. The capacitor 130' would appear in FIG. 1 below the plane of the figure. FIG. 5A illustrates another capacitor footprint 130" by a dashed-line perimeter. The capacitor 130" would appear in FIG. 1 below the plane of the figure. As illustrated, the substrate first pad 116 accommodates both the electrical first bump 114 (refer to FIG. 1) and the power terminal 132 (refer to FIG. 1) of the capacitor 130.

In one embodiment, several capacitors are deployed along the X-dimension between the substrate and the top structure in order to service the electronic component, as will now be discussed with reference to FIG. 6.

Figure 6:
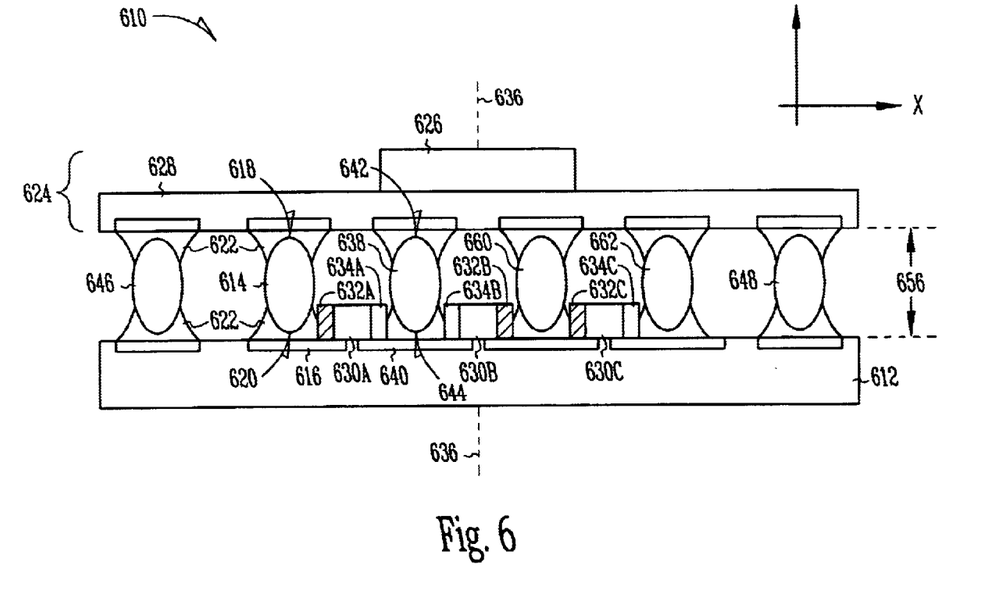
FIG. 6 is an elevational cut-away of another system according to an embodiment.

FIG. 6 is an elevational section of another system 610 according to an embodiment. The system 610 relates to a decoupling capacitor system. The system 610 includes a substrate 612, and an electrical first bump 614 that is adhered to a substrate first pad 616.

In one embodiment, the substrate 612 is a motherboard for a digital computer, an electronic apparatus, or the like. In another embodiment, the substrate 612 is a main board for a specialized device such as a hand-held personal digital assistant (PDA) or the like. In one embodiment, the substrate 612 is a board for a wireless device or the like.

The electrical first bump 614 is typically a high melting-point solder that includes a top end 618 and a bottom end 620. Adhesion of the electrical first bump 614 to the substrate first pad 616 is by a low melting-point solder 622. Both the electrical first bump 614 and the solder may be a Pb-containing solder or a substantially Pb-free solder.

A top structure 624 is disposed at the top end 618 of the electrical first bump 614. In one embodiment, the top structure 624 includes an electronic component 626 such as a processor, an ASIC, or the like. In one embodiment, the top structure 624 includes a power socket 628 that carries an electronic component 626. In one embodiment, the top structure 624 includes an interposer (also represented generally as item 628) that may make connection with an electronic component and/or a power socket. In one embodiment, the top structure 624 includes a combination of at least two of an electronic component, a power socket, and an interposer. Alternatively, the top structure 624 is a packaged electronic component without a power socket or the like, or without an interposer or the like, or without either.

A first capacitor 630A is disposed above the substrate 612 and is substantially contiguous to the electrical first bump 614. The capacitor 630A includes a power or Vcc terminal 632A and a ground or Vss terminal 634A. By "substantially contiguous" it is meant that the capacitor 630A and the electrical first bump 614 are electrically touching at the power terminal 632A. In another embodiment "substantially contiguous" means that there is no structure closer to the electrical first bump 614 than the power terminal 632A of the capacitor 630A. In another embodiment "substantially contiguous" means that the capacitor is placed proximate to the electrical first bump, within about one lateral diameter (in the X-dimension) of the electrical first bump.

In one embodiment, the capacitor 630A is one of a plurality of capacitors 630A, 630B, and 630C that are arrayed beneath the electronic component 626, and the array is substantially centered along a symmetry line 636 that bisects the electronic component 626 in the X-dimension. In this embodiment, where three capacitors 630A, 630B, and 630C are arrayed beneath the electronic component 626, the capacitor 630B is bisected by the symmetry line 636, and the capacitors 630A and 630C are spaced apart opposite each other from the symmetry line 636.

The capacitor 630A is disposed between the electrical first bump 614 and an electrical second bump 638 that is substantially contiguous to the ground terminal 634A. The electrical second bump 638 is adhered to a substrate second pad 640. Like the electrical first bump 614, the electrical second bump 638 is typically a high melting-point solder that includes a top end 642 and a bottom end 644. Adhesion of the electrical second bump 638 to the substrate second pad 640 is by the low melting-point solder 622.

The electrical first bump 614 includes a first characteristic vertical dimension (in the Z-dimension) that originates at or near the substrate first pad 616 and that terminates near the top structure 624. The electrical second bump 638 includes a second characteristic vertical dimension that is substantially equal to the first characteristic vertical dimension of the electrical first bump 614. The capacitors 630A, 630B, and 630C include a third characteristic vertical dimension that originates at or near the substrate first pad 616 and that terminates below the top structure 624. In one embodiment, the capacitors 630A, 630B, and 630C are provided in parallel with relation to the electronic component 626. Further, in one embodiment, other capacitors are deployed either above or below the plane of the figure, or both.

Other electrical bumps 646, 648, 660, and 662 are depicted in FIG. 6. The electrical bumps 660 and 662 represent electrical third and fourth bumps, respectively, in relation to the electrical first bump 614 and the electrical second bump 638. In this embodiment, the electrical bumps 646 and 648 are data/control signal bumps for the electronic component 626. A power plane (not pictured) and a ground plane (not pictured) are also within the substrate 612, along with signal planes (not pictured) for the additional electrical bumps 646 and 648.

The illustration of FIG. 6 depicts electrical first bump 614, electrical second bump 638, electrical third bump 660, and electrical fourth bump 662 as having an oblong shape that gives each bump an aspect ratio (height:width) of greater than one. In one embodiment, the standoff 656 is increased by having electrical bumps with an aspect ratio of greater than one, although the aspect ratio may be substantially equal to one. Where a high-performance capacitor is selected, it may have a third characteristic vertical dimension that is less than the first characteristic vertical dimension of the electrical first bump 614.

In the embodiment of FIG. 6, all the decoupling capacitors are disposed upon the substrate 612. Where it is applicable to dispose all decoupling capacitors upon the top structure 624, a system similar to that depicted in FIG. 7 is used, as will now be discussed.

Figure 7:
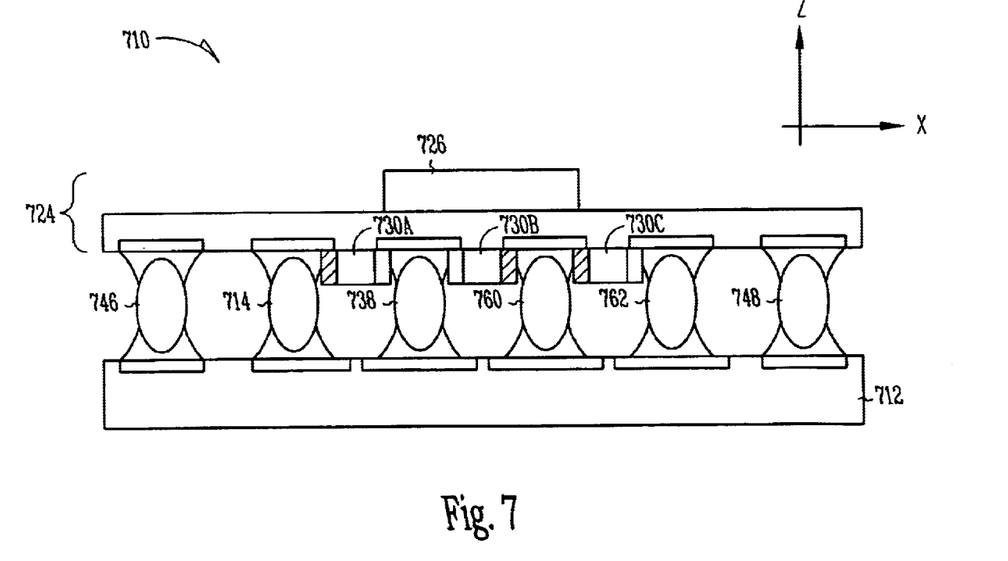
FIG. 7 is an elevational cut-away of yet another system according to an embodiment.

FIG. 7 is an elevational cut-away of yet another system 710 according to an embodiment. In FIG. 7 a system 710 includes a substrate 712 and a top structure 724. Disposed on substrate 712 are an electrical first bump 714, an electrical second bump 738, an electrical third bump 760, and an electrical fourth bump 762. A capacitor 730A is disposed upon the top structure 724 between the electrical first bump 714 and the electrical second bump 738. A capacitor 730B is disposed upon the top structure between the electrical second bump 738 and the electrical third bump 760. Similarly, a capacitor 730C is disposed upon the top structure between the electrical third bump 760 and the electrical fourth bump 762. The placement of the capacitors 730A, 730B, and 730C closer to the electronic component 726 has the effect of a faster transient load response by the capacitors.

Although the embodiments in FIGS. 6 and 7 depict three capacitors in the X-dimension, other embodiments include an embodiment having two capacitors arrayed linearly in the X-dimension, and an embodiment having more than three capacitors arrayed linearly in the X-dimension. Further embodiments have more capacitors deployed above and/or below the plane of the figure.

According to another embodiment, a combination of capacitors is disposed in part upon a substrate and in part upon a top structure, as will now be described regarding FIG. 8.

Figure 8:
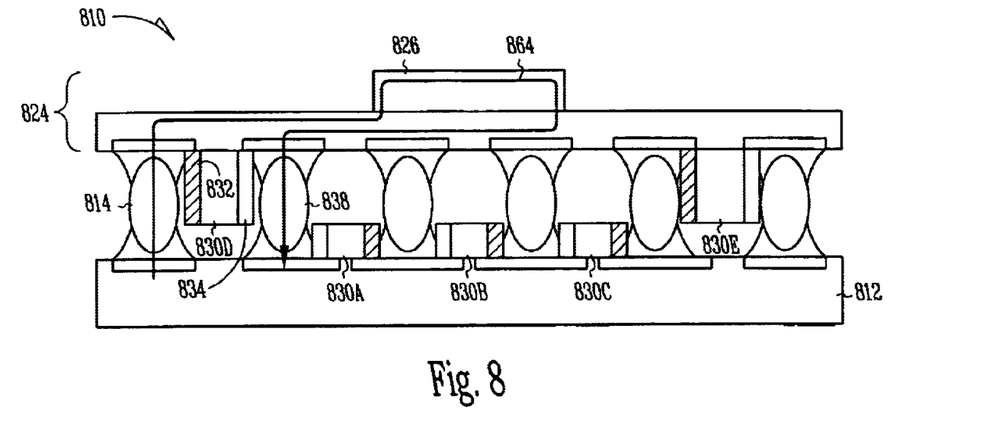
FIG. 8 is an elevational cut-away of still another system according to an embodiment.

FIG. 8 is an elevational cut-away of a still another system 810 according to an embodiment. The system 810 relates to a decoupling capacitor system. The system 810 includes a substrate 812 and a top structure 824 including an electronic component 826. The system 810 illustrates a combination of capacitors 830A, 830B, 830C, 830D, and 830E. The capacitors 830A, 830B, 830C are disposed upon the substrate 812, and the capacitors 830D and 830E are disposed upon the top structure 824. In one embodiment, the capacitors 830A, 830B, 830C have a first capacity and a first response time, and the capacitors 830D and 830E have a second capacity that is greater than the first capacity. In another embodiment, the capacitors 830D and 830E have a second response time that is slower than the first response time.

The embodiment depicted in FIG. 8 is employed in a situation wherein the disparate coefficients of thermal expansion (CTE) for the capacitors 830A, 830B, and 830C and the top structure 824 lead to cracking and disconnection issues for the capacitors 830A, 830B, and 830C during testing and/or field use. Where the source of heat is the electronic component 826, in one embodiment, the distance from the electronic component 826 and the capacitors 830D and 830E is sufficient that the CTE disparity is of minor consequence during testing and/or field use. Although it has been discussed as an alternative embodiment for each figure set forth in this disclosure, it is again noted that the capacitors 830A, 830B, 830C, 830D, and 830E, or one of them, or a subcombination of them can have a capacitor standoff like the capacitor standoff 231 depicted in FIG. 2A. Accordingly, whether a given capacitor is mounted upon the substrate 812 or the underside of the top structure 824, the capacitor can have a capacitor standoff such that the capacitor is not in direct contact with the either the substrate and/or the underside of the top structure 824. The capacitor standoff allows for more thermal expansion differences because the capacitor is substantially suspended in the softer solder.

Figure 9:
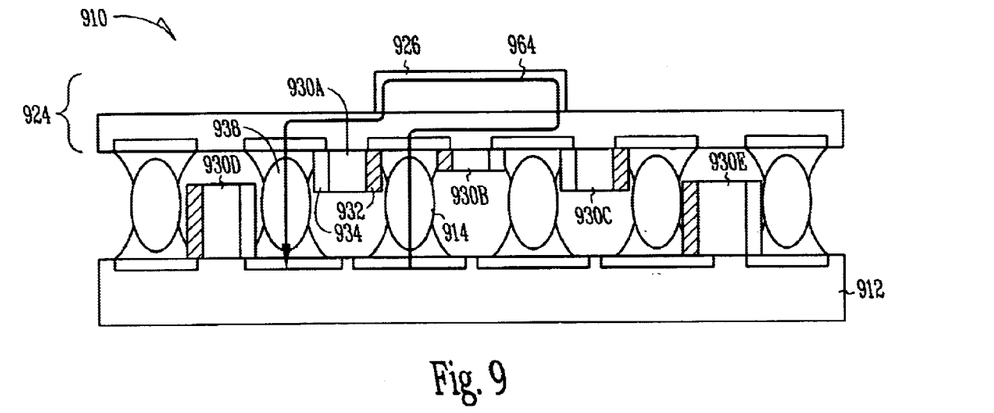
FIG. 9 is an elevational cut-away of a further system according to an embodiment.

An alternative embodiment is depicted in FIG. 9, which will now be described.

FIG. 9 is an elevational cut-away of a further system 910 according to an embodiment. The system 910 relates to a decoupling capacitor system. The system 910 includes a substrate 912 and a top structure 924 including an electronic component 926. The system 910 illustrates a combination of capacitors 930A, 930B, 930C, 930D, and 930E. The capacitors 930A, 930B, and 930C are disposed upon the top structure 924, and the capacitors 930D and 930E are disposed upon the substrate 912. In one embodiment, the capacitor 930B has a first capacity and a first response time. The capacitors 930A and 930C have a second capacity and a second response time. The capacitors 930D and 930E have a third capacity that is greater than the first capacity and the second capacity. In another embodiment, the capacitors 930D and 930E have a third response time that is slower than the first response time. In another embodiment, the capacitors 930A and 930C have a response time that is slower than the capacitor 930B, but faster than the capacitors 930D and 930E. Accordingly, in one embodiment the capacitor 930B has the fastest response time and the lowest capacity.

The embodiment depicted in FIG. 9 is employed in a situation wherein the disparate coefficients of thermal expansion (CTE) for the capacitors 930A, 930B, and 930C and the top structure 924 are not great enough to cause cracking and disconnection issues during testing and/or field use. Further, it is a characteristic of this embodiment to place the capacitors 930A, 930B, and 930C as close to the electronic component 926 as possible within the area between the substrate 912 and the top structure 924. The placement of the capacitors 930D and 930E is depicted as on the substrate 912, but an alternative embodiment includes their placement (not pictured) upon the top structure 924. Another embodiment relates to a method of forming a current loop in a decoupling capacitor system. According to various embodiments, the current loop is not convoluted. This will now be explained with reference to FIG. 10.

Figure 10:
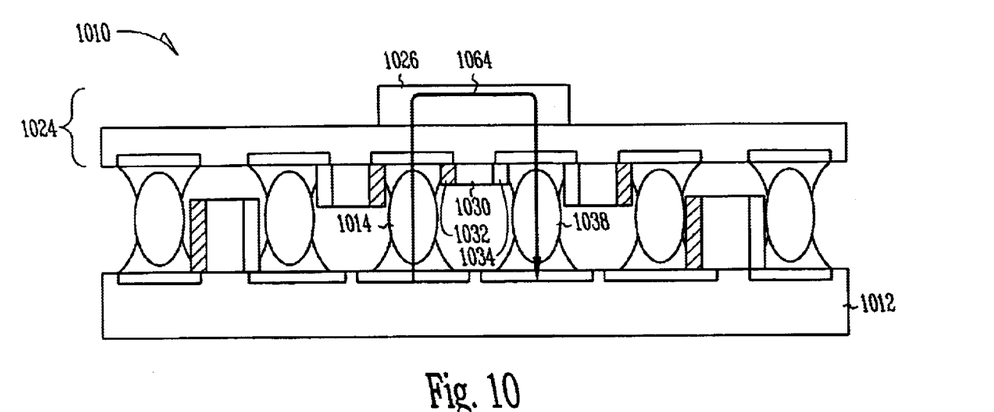
FIG. 10 is an elevational cut-away of yet a further system according to an embodiment.

FIG. 10 is an elevational cut-away of yet a further system 1010 according to an embodiment. The system 1010 has a simple current loop 1064. The system 1010 includes a substrate 1012 and a top structure 1024 including an electronic component 1026. According to an embodiment, a simple current loop 1064 originates out of the power plane (not pictured) of the substrate 1012. The simple current loop 1064 passes upwardly from a capacitor Vcc terminal 1032 and an electrical bump 1014. Next, the simple current loop 1064 passes into the power plane (not pictured) and/or a power via (not pictured) of the top structure 1024 and into the electronic component 1026. Thereafter, the simple current loop 1064 passes out of the electronic component 1026 and into the ground plane (not pictured) and/or a ground via (not pictured) of the top structure 1024. Finally, the simple current loop 1064 concludes in the capacitor Vss terminal 1034 and ground electrical bump 1038, and it terminates in the ground plane (not pictured) of the substrate 1012. This simple current loop 1064 embodiment is therefore not convoluted, as compared to the loop 64 depicted in FIG. 11.

In one embodiment, the current loop forms a simple deflected loop, but it does not form any convolution. FIG. 8 is an example of a simple deflected current loop 864. The simple deflected current loop 864 passes upwardly from a capacitor Vcc terminal 832 and electrical bump 814. Next, the simple deflected current loop 864 passes into the power plane (not pictured) and/or a power via (not pictured) of the top structure 824 and into the electronic component 826. Thereafter, the simple deflected current loop 864 passes out of the electronic component 826 and into the ground plane (not pictured) and/or a ground via (not pictured) of the top structure 824. Finally, the simple deflected current loop 864 concludes in the capacitor Vss terminal 834 and ground electrical bump 838, and it terminates in the ground plane (not pictured) of the substrate 812. This simple deflected current loop 864 embodiment is also not convoluted, in comparison to the convoluted loop 64 depicted in FIG. 11.

It is again noted that the simple loop and the simple deflected loop are each shorter current loops than what exists in the conventional technology.

FIG. 9 illustrates another embodiment of a simple deflected current loop 964. The simple deflected current loop 964 passes upwardly from a capacitor Vcc terminal 932 and electrical bump 914. Next, the simple deflected current loop 964 passes into the power plane (not pictured) and/or a power via (not pictured) of the top structure 924 and into the electronic component 926. Thereafter, the simple deflected current loop 964 passes out of the electronic component 926 and into the ground plane (not pictured) and/or a ground via (not pictured) of the top structure 924. Finally, the simple deflected current loop 964 concludes in the shared capacitor Vss terminal 934 and ground electrical bump 938, and it terminates in the ground plane (not pictured) of the substrate 912. This simple deflected current loop 964 embodiment is also, by definition, not convoluted.

Figure 12:
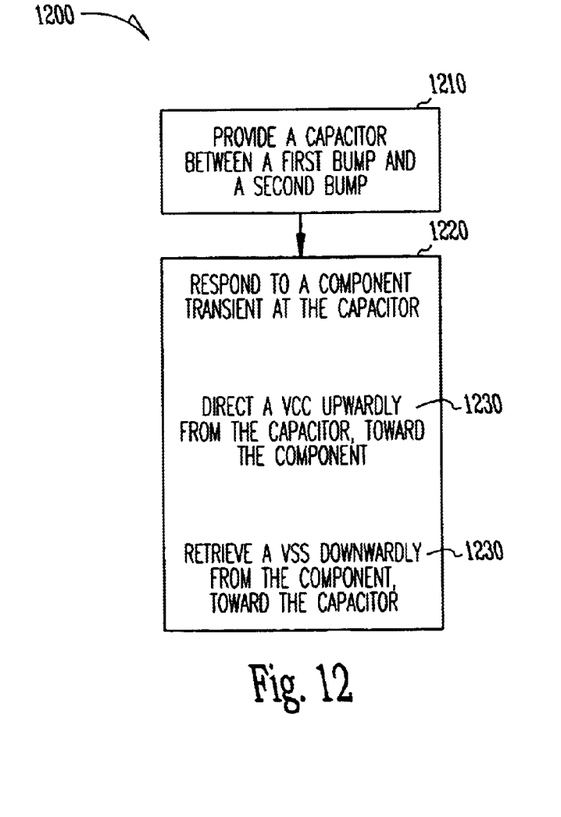
FIG. 12 is a method flow diagram according to an embodiment.

FIG. 12 illustrates a method flow diagram 1200 according to an embodiment.

In 1210, a decoupling capacitor is provided between an electrical first bump and an electrical second bump.

In 1220, a component transient is responded to at the decoupling capacitor.

In 1230, a supply voltage Vcc is directed upwardly from the capacitor toward the component.

In 1240, a ground voltage Vss is retrieved downwardly from the component toward the capacitor.

In one embodiment, the method causes a simple current loop to form as set forth herein. In another embodiment, the method causes a simple deflected current loop to form as set forth herein.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description of Embodiments of the Invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A decoupling capacitor system comprising:
    a substrate including a substrate first pad and a substrate second pad;
    an electrical first bump including a bottom end and a top end, wherein the bottom end is adhered to the first pad;
    an electrical second bump including a bottom end and a top end, wherein the bottom end is adhered to the second pad;
    a first capacitor disposed above the substrate and substantially contiguous to the electrical first bump;
    a top structure disposed at the electrical first bump top end, wherein the top structure is in electrical communication with the first capacitor and is selected from an electronic component, an interposer, a socket, and combinations thereof; and
    a current loop that originates in the first capacitor, that passes through the top structure, and that terminates in the first capacitor, wherein the current loop is selected from a simple current loop and a simple deflected current loop.

2. The decoupling capacitor system according to claim 1, wherein the electrical first bump includes a first characteristic vertical dimension, wherein the electrical second bump includes a second characteristic vertical dimension, wherein the capacitor includes a third characteristic vertical dimension, and wherein the first characteristic vertical dimension is greater than the third characteristic vertical dimension.

3. The decoupling capacitor system according to claim 1, wherein the electrical first bump includes a first characteristic vertical dimension, wherein the electrical second bump includes a second characteristic vertical dimension, wherein the capacitor includes a third characteristic vertical dimension, and wherein the first characteristic vertical dimension is substantially equal to the third characteristic vertical dimension.

4. The decoupling capacitor system according to claim 1, wherein the electrical first bump includes a first characteristic vertical dimension, wherein the electrical second bump includes a second characteristic vertical dimension, wherein the capacitor includes a third characteristic vertical dimension, wherein the first characteristic vertical dimension is greater than the third characteristic vertical dimension, and wherein the capacitor is disposed on the substrate.

5. The decoupling capacitor system according to claim 1, wherein the electrical first bump includes a first characteristic vertical dimension, wherein the electrical second bump includes a second characteristic vertical dimension, wherein the capacitor includes a third characteristic vertical dimension, wherein the first characteristic vertical dimension is greater than the third characteristic vertical dimension, and wherein the capacitor is disposed on the top structure.

6. The decoupling capacitor system according to claim 1, the first capacitor further including:
    a Vcc terminal; and
    a Vss terminal, wherein the first pad makes electrical connection to the electrical first bump and the capacitor Vcc terminal, and wherein the second pad makes electrical connection to the electrical second bump and the capacitor Vss terminal.

7. The decoupling capacitor system according to claim 1, the first capacitor further including:
    a Vcc terminal;
    a Vss terminal;
    a top structure first pad, wherein the electrical first bump top end is adhered to the top structure first pad;
    a top structure second pad, wherein the electrical second bump top end is adhered to the top structure second pad; and
    wherein the top structure first pad makes electrical connection to the electrical first bump and the capacitor Vcc terminal, and wherein the top structure second pad makes electrical connection to the electrical second bump and the capacitor Vss terminal.

8. The decoupling capacitor system according to claim 1, further including:
    at least one capacitor that is arrayed linearly with and including the first capacitor, wherein the at least one capacitor is disposed on the substrate.

9. The decoupling capacitor system according to claim 1, further including:
    at least one capacitor that is arrayed linearly with and including the first capacitor, wherein the at least one capacitor is disposed on the top structure.

10. An apparatus comprising:
    a first decoupling capacitor;
    an electronic component; and
    a current loop that originates in the decoupling capacitor, that passes through the electronic component, and that terminates in the first decoupling capacitor, wherein the current loop is selected from a simple current loop and a simple deflected current loop.

11. The apparatus according to claim 10, wherein the first decoupling capacitor is part of a plurality of capacitors that are arrayed linearly upon a substrate, wherein the substrate is spaced apart from the electronic component.

12. The apparatus according to claim 10, wherein the first decoupling capacitor is part of a plurality of capacitors that are arrayed linearly upon a top structure, wherein the top structure is selected from an electronic component, a power socket, an interposer, and combinations thereof.

13. The apparatus according to claim 10, wherein the first decoupling capacitor is part of a plurality of capacitors that are arrayed linearly upon a substrate, wherein the substrate is spaced apart from the electronic component, wherein the first decoupling capacitor is also disposed upon a top structure, and wherein the top structure is selected from an electronic component, a power socket, an interposer, and combinations thereof.

14. A current loop in a decoupling capacitor system comprising:
   a capacitor including a power terminal and a ground terminal;
   a component disposed above the capacitor;
   a loop origin in the power terminal;
   a loop first direction out of the power terminal and toward the component;
   a loop second direction within the component;
   a loop third direction out of the component and toward the ground terminal; and
   a loop terminus in the ground terminal, wherein the loop is selected from a simple loop and a simple deflected loop.

15. An article comprising:
   a substrate including a power plane and a ground plane;
   a Vcc first pad and a Vss second pad disposed above the substrate and in respective electrical communication with the power plane and the ground plane;
   a Vcc electrical first bump disposed above the Vcc first pad;
   a Vss electrical second bump disposed above the Vss second pad;
   a capacitor including a Vcc terminal and a Vss terminal disposed between the electrical first bump and the electrical second bump, wherein the Vcc terminal is disposed above the Vcc first pad and the Vss terminal is disposed above the Vss second pad;
   a top structure coupled to the Vcc electrical first bump and the Vss electrical second bump; and
   a current loop that originates in the capacitor, that passes through the top structure, and that terminates in the capacitor, wherein the current loop is selected from a simple current loop and a simple deflected current loop.

16. The article according to claim 15, wherein the top structure is selected from an electronic component, an interposer, a socket, and combinations thereof.

17. The article according to claim 15, wherein the Vcc first pad includes a first region that has a shape characteristic of the Vcc electrical first bump, and a second region that has a shape characteristic of the Vcc terminal.

18. The article according to claim 15, wherein the Vcc first pad includes a plurality of first regions, each of which has a shape characteristic of the Vcc electrical first bump, and a plurality of second regions, each of which has a shape characteristic of the Vcc terminal.

19. The article according to claim 15, wherein the Vss second pad includes a first region that has a shape characteristic of the Vss electrical second bump, and a second region that has a shape characteristic of the Vss terminal.

20. The article according to claim 15, wherein the Vss first pad includes a plurality of first regions, each of which has a shape characteristic of the Vss electrical first bump, and a plurality of second regions, each of which has a shape characteristic of the Vss terminal.

21. A decoupling capacitor system comprising:
   a substrate including a substrate first pad and a substrate second pad;
   an electrical first bump including a bottom end and a top end, wherein the bottom end is adhered to the first pad;
   an electrical second bump including a bottom end and a top end, wherein the bottom end is adhered to the second pad;
   a first capacitor disposed above the substrate;
   a top structure disposed at the electrical first bump top end, wherein the top structure is in electrical communication with the first capacitor and is selected from an electronic component, an interposer, a socket, and combinations thereof;
   at least one capacitor in addition to the first capacitor, wherein the at least one capacitor in addition to the first capacitor is disposed, selected from above and on the substrate, and on the top structure; and
   a current loop that originates in the first capacitor, that passes through the top structure, and that terminates in the first capacitor, wherein the current loop is selected from a simple current loop and a simple deflected current loop.

22. The decoupling capacitor system according to claim 21, wherein the first capacitor has first response time, wherein the at least one capacitor in addition to the first capacitor has a second response time that is slower than the first response time.

23. The decoupling capacitor system according to claim 21, wherein the first capacitor has first capacity, wherein the at least one capacitor in addition to the first capacitor has a second capacity that is greater than the first capacity.

24. The decoupling capacitor system according to claim 21, wherein the first capacitor is disposed above and on the substrate and substantially contiguous to the electrical first bump.

25. The decoupling capacitor system according to claim 21, wherein the first capacitor is disposed on the top structure and substantially contiguous to the electrical first bump.

* * * * *